United States Patent
Suh

(10) Patent No.: US 7,960,910 B2
(45) Date of Patent: Jun. 14, 2011

(54) ORGANIC LIGHT EMITTING DISPLAY DEVICE AND METHOD FOR MANUFACTURING THE SAME

(75) Inventor: Min Chul Suh, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 592 days.

(21) Appl. No.: 11/798,423

(22) Filed: May 14, 2007

(65) Prior Publication Data

US 2007/0267973 A1 Nov. 22, 2007

(30) Foreign Application Priority Data

May 16, 2006 (KR) .................. 10-2006-0043781

(51) Int. Cl.
*H01J 1/62* (2006.01)
*H01J 63/04* (2006.01)
(52) U.S. Cl. .................. 313/504; 313/506; 313/512
(58) Field of Classification Search .......... 313/504, 313/506, 512
See application file for complete search history.

(56) References Cited

U.S. PATENT DOCUMENTS

| 7,170,224 | B2 | 1/2007 | Lee et al. | |
|---|---|---|---|---|
| 7,187,122 | B2 | 3/2007 | Kim | |
| 2003/0071569 | A1* | 4/2003 | Chung et al. | 313/512 |
| 2003/0184219 | A1* | 10/2003 | Duggal et al. | 313/506 |
| 2003/0189403 | A1* | 10/2003 | Yamada et al. | 313/511 |
| 2005/0040759 | A1* | 2/2005 | Kobayashi | 313/506 |

FOREIGN PATENT DOCUMENTS

| JP | 2001-126868 | 5/2001 |
|---|---|---|
| KR | 10-2002-0056962 | 7/2002 |
| KR | 10-2002-0093169 A | 12/2002 |
| KR | 10-2004-0039608 A | 5/2004 |
| KR | 10-2004-0071438 A | 8/2004 |
| KR | 10-2005-0000130 | 1/2005 |
| KR | 10-2005-0039014 A | 4/2005 |

* cited by examiner

*Primary Examiner* — Nimeshkumar D Patel
*Assistant Examiner* — Thomas A Hollweg
(74) *Attorney, Agent, or Firm* — Lee & Morse, P.C.

(57) ABSTRACT

An organic light emitting display device, includes a substrate, at least one organic light emitting diode on the substrate, a functional layer including an opaque material and a light transmitting inorganic material, and an encapsulation layer on the organic light emitting diode, the encapsulation layer including at least one inorganic layer and at least one organic layer.

25 Claims, 2 Drawing Sheets

ORGANIC LIGHT EMITTING DISPLAY DEVICE AND METHOD FOR MANUFACTURING THE SAME

BACKGROUND OF THE INVENTION

1. Field of the Invention

The present invention relates to an organic light emitting display device. More particularly, the present invention relates to an organic light emitting display device having a structure capable of shielding the organic light emitting diode from moisture and oxygen, while minimizing heat damage from ultraviolet light thereto.

2. Description of the Related Art

In general, an organic light emitting display device refers to a flat panel display device capable of displaying images by emitting visible light triggered by electrical excitation of an organic compound. As such, the conventional organic light emitting display device may exhibit superior properties, such as a low driving voltage, a thin screen size, wide viewing angles, and a quick response speed. The conventional organic light emitting display device may include a substrate, an organic light-emitting diode with an organic light-emitting material, and an encapsulation means to protect the organic light-emitting diode from moisture, oxygen, and heat.

The conventional encapsulation means of the organic light emitting display device may include, for example, an encapsulation substrate or an encapsulation layer. However, encapsulating with the conventional encapsulation layer may include a process of hardening the encapsulation layer by irradiation thereof with ultraviolet (UV) light and, thereby, damaging the organic light-emitting diode by subjecting the organic light emitting material to an excessive heat, i.e., a processing temperature of above about 150° C.

Accordingly, there exists a need for an organic light-emitting display device having a structure capable of efficiently shielding the organic light emitting diode from moisture and oxygen, while being able to minimize damage to the organic light emitting diode due to UV light.

SUMMARY OF THE INVENTION

The present invention is therefore directed to an organic-light emitting display device, which substantially overcomes one or more of the disadvantages of the related art.

It is therefore a feature of the present invention to provide an organic light emitting display device having a structure capable of minimizing UV light damage to an organic light emitting diode.

It is another feature of the present invention to provide an organic light emitting display device having a structure capable of effectively shielding an organic light emitting diode from moisture and oxygen.

At least one of the above and other features and advantages of the present invention may be realized by providing an organic light emitting display device, including a substrate, at least one organic light emitting diode on the substrate, a functional layer including an opaque material and a light transmitting inorganic material, and an encapsulation layer on the organic light emitting diode, an encapsulation layer on the organic light emitting diode, the encapsulation layer including at least one inorganic layer and at least one organic layer.

The functional layer may be an auxiliary layer on the organic light emitting diode. The auxiliary layer may include an opaque material having a decreasing density gradient as a distance toward the encapsulation layer decreases. Alternatively, the functional layer may be a cathode electrode of the organic light emitting diode. The cathode electrode may have a light transmittance of about 40% to about 60%. The encapsulation layer may include a plurality of organic layers between a plurality of inorganic layers.

The density gradient of the opaque material may decrease as a distance toward the encapsulation layer decreases. The opaque material may include at least one of iron (Fe), cobalt (Co), vanadium (V), titanium (Ti), aluminum (Al), silver (Ag), silicon (Si), germanium (Ge), yttrium (Y), zinc (Zn), zirconium (Zr), tungsten (W), tantalum (Ta), copper (Cu), and platinum (Pt). The inorganic material may include at least one of silicon oxide (SiOx), silicon nitride (SiNx), magnesium fluoride ($MgF_2$), calcium fluoride ($CaF_2$), aluminum oxide ($Al_2O_3$), tin oxide ($SnO_2$), indium oxide ($In_2O_3$), indium-tin-oxide (ITO), and indium-zinc-oxide (IZO).

The inorganic layer of the encapsulation layer may include aluminum oxynitride ($AlO_xN_y$), aluminum (Al), aluminum oxide ($Al_2O_3$), silicon oxide ($SiO_2$), or silicon oxynitride ($SiO_xN_y$). A thickness of the inorganic layer of the encapsulation layer may be about 30 to about 100 nm. The organic layer of the encapsulation layer may include a UV-hardened resin. The organic layer of the encapsulation layer may include epoxy, acrylate, or urethane acrylate.

The organic light emitting display device may further include a pixel definition layer in communication with the cathode electrode of the organic light emitting diode. The pixel definition layer may be an organic layer.

At least one of the above and other features and advantages of the present invention may also be realized by providing a method for manufacturing an organic light emitting display device, including providing a substrate, forming a first electrode on the substrate, forming an organic layer on the first electrode, forming a functional layer on the organic layer by depositing an opaque material and a light transmitting inorganic material, forming an encapsulation layer on the functional layer, and irradiating the encapsulation layer with light. Irradiating the encapsulation layer with light may include irradiating with UV light.

Forming the encapsulation layer may include depositing at least one organic layer and at least one inorganic layer. The functional layer may be a second electrode. Alternatively, the method may further include forming a second electrode on the organic layer before forming the functional layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
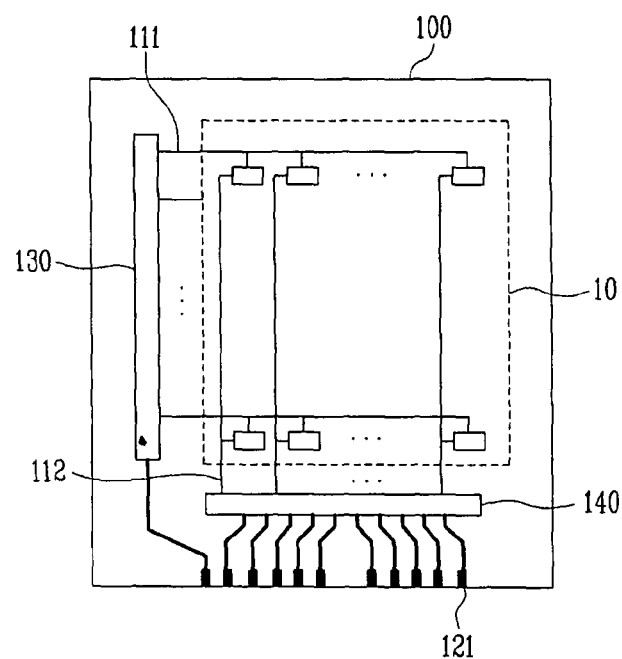
FIG. 1 illustrates a plan view of an organic light emitting display device according to an exemplary embodiment of the present invention.

Korean Patent Application No. 10-2006-0043781, filed on May 16, 2006, in the Korean Intellectual Property Office, and entitled: "Organic Light Emitting Display Device and Method for Manufacturing the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
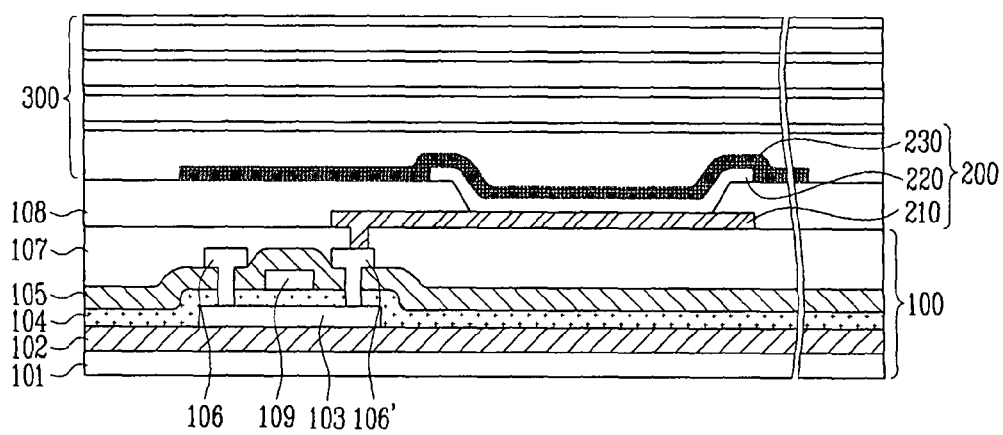
FIG. 2 illustrates an enlarged cross-sectional view of a pixel area of the organic light emitting display device illustrated in FIG. 1.

Hereinafter, an exemplary embodiment of an organic light emitting display device according to the present invention will be described in more detail below with reference to FIGS. 1-3. As illustrated in FIGS. 1-2, an organic light emitting display device according to an exemplary embodiment of the present invention may include a substrate 100, an organic light emitting diode 200, and an encapsulation layer 300. It should be noted, however, that even though the organic light-emitting display device is described below with respect to an active driving type method, other driving methods are not excluded from the scope of the present invention.

The substrate 100 of the organic light emitting display device may be divided into a pixel area 10 and a non-pixel area surrounding the pixel area 10, as illustrated in FIG. 1. Further, as illustrated in FIG. 2, the substrate 100 may include a deposition substrate 101, a buffer layer 102 on the deposition substrate 101, at least one thin film transistor on the buffer layer 102, and a protection layer 107 on the thin film transistor. The thin film transistor of the substrate 100 may be formed in the pixel area 10 of the substrate 100, and may include a semiconductor layer 103, e.g., a p-type or n-type, with an activation layer and an ohmic contact layer deposited in a predetermined pattern on an upper surface of the buffer layer 102, a gate insulation layer 104 and an interlayer insulation layer 105 sequentially deposited on the deposition substrate 101 to coat the semiconductor layer 103. Source and drain electrodes 106 and 106' of the thin film transistor may be on the interlayer insulation layer 105 and electrically connected to the semiconductor layer 103 through contact holes in the interlayer insulation layer 105 and the gate insulation layer 104. A gate electrode 109 of the thin film transistor may be between the interlayer insulation layer 105 and the gate insulation layer 104. Any additional details regarding elements and materials of the substrate 100 may be well known by one of ordinary skill in the art, and therefore, will not be described in detail herein.

The organic light emitting diode 200 of the organic light-emitting display device according to an embodiment of the present invention may be formed on a pixel definition layer 108 in the pixel area 10 of the substrate 100. The organic light emitting diode may include an anode electrode 210 on the pixel definition layer 108, a cathode electrode 230 on the anode electrode 210, and an organic light emitting layer 220 therebetween. The anode electrode 210 may be electrically connected to the drain electrode 106' of the thin film transistor via an opening in the pixel definition layer 108. Accordingly, when voltage is applied to the anode and cathode electrodes 210 and 230, a hole may be injected from the anode electrode 210 to the organic light-emitting layer 220 via a hole transportation layer, and an electron may be injected from the cathode electrode 230 to the organic light-emitting layer 220 via an electron transportation layer, so that an exiton may be formed when the electron and the hole are combined in the organic light emitting layer 220. As the excitation state of the exiton drops, photoluminescent molecules of the organic light emitting layer 220 emit light to form images.

The cathode electrode 230 of the organic light-emitting diode 200 according to an embodiment of the present invention may include an opaque material, e.g., a metal, and a light transmitting inorganic material, e.g., a transparent material. The opaque material may include at least one metal or metalloid, e.g., iron (Fe), cobalt (Co), vanadium (V), titanium (Ti), aluminum (Al), silver (Ag), silicon (Si), germanium (Ge), yttrium (Y), zinc (Zn), zirconium (Zr), tungsten (W), tantalum (Ta), copper (Cu), platinum (Pt), and like metals. The light transmitting inorganic material may include at least one of magnesium fluoride ($MgF_2$), calcium fluoride ($CaF_2$), aluminum oxide ($Al_2O_3$), tin oxide ($SnO_2$), indium oxide ($In_2O_3$), indium-tin-oxide (ITO), indium-zinc-oxide (IZO), silicon oxide (SiOx), and silicon nitride (SiNx), where x>1. In this respect, it should be noted that even though the opaque material may generally be a material not transmitting light, a substantially thin opaque material, i.e., an opaque material having a sufficiently low thickness to transmit some light, is not excluded from the scope of the present invention.

The cathode electrode 230 may be formed by mixing the opaque material and the light transmitting inorganic material to provide a mixture having a non-uniform density of the opaque material. More specifically, the cathode electrode 230 may have an increasing opaque material density gradient toward the anode electrode 210. In other words, the density of the opaque material may gradually increase as a distance toward the anode electrode 210 decreases, i.e., the density of the opaque material may gradually decrease as a distance toward the encapsulation layer 300 decreases.

Without intending to be bound by theory, it is believed that an opaque material density gradient in the cathode electrode 230 may provide a respective gradient of refractive indices within the cathode electrode 230, and thereby, facilitate control of light transmittance therethrough. More specifically, gradual variation in refractive indices within the cathode electrode 230 may provide minimized interface reflection therein. Accordingly, light transmittance through the cathode electrode layer may be controlled to provide light transmittance of about 40%-60 %.

A cathode electrode 230 having high light transmittance through an entire surface thereof may be beneficial; however, a potential transmittance of UV light therethrough during processing of the organic light-emitting diode 200, i.e., hardening of an encapsulation layer for the organic light-emitting diode 200 by UV irradiation, may damage the organic light-emitting diode 200. Accordingly, transmittance through the cathode electrode 230 may be about 40% to about 60%. A transmittance below about 40% may sufficiently inhibit detrimental UV light effects; however, the light extracting efficiency of the organic light emitting diode 200 may be too low. On the other hand, even though the light extracting efficiency of the organic light emitting diode 200 may be very high at a light transmittance of above about 60%, detrimental effects of the UV light may not be sufficiently prevented, thereby generating an increase of the drive voltage of the organic light emitting device.

The encapsulation layer 300 of the organic light-light emitting display device may be formed on the cathode electrode 230, and may include at least one inorganic layer 320 and at least one organic layer 310 to provide sufficient protection to the cathode electrode 230 from moisture and oxygen. The inorganic layer 310 of the encapsulation layer 300 may include, e.g., aluminum (Al), aluminum oxide ($A_2O_3$), silicon oxide ($SiO_2$), silicon oxynitride (SiOxNy), and aluminum oxynitride (AlOxNy), and may be deposited to a thickness of about 30 nm to about 100 nm. A thickness of the inorganic layer below about 30 nm may be insufficient to prevent penetration of moisture and oxygen therethrough. A thickness above about 100 nm may result in an increased overall thickness of the organic light emitting display device.

Figure 3:
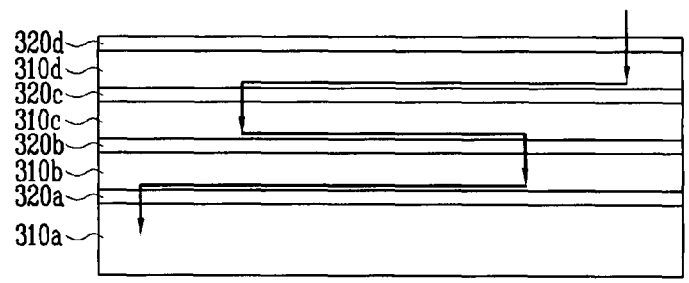
FIG. 3 illustrates a cross-sectional view of an encapsulation layer of the organic light emitting display device illustrated in FIG. 1.

More specifically, as illustrated in FIG. 3, each of the organic and inorganic layers 310 and 320 of the encapsulation layer 300 may have a multi-layer structure to minimize moisture and oxygen penetration toward the cathode electrode 230. In particular, when the organic and inorganic layers 310 and 320 include a plurality of sub-layers, even if an aperture is formed in one of the sub-layers, an increased length of a diffusion path through the plurality of sub-layers may substantially minimize diffusion of oxygen and moisture therethrough.

The organic layer 310 may include first, second, third and fourth organic sub-layers 310a, 310b, 310c, and 310d, respectively, to enhance flattening and flexibility of the encapsulation layer 300. The first organic sub-layer 310a, as illustrated in FIG. 3, may be deposited on an upper surface of the cathode electrode 230 to a relatively high thickness to enhance flattening. The inorganic layer 320 may include first, second, third and fourth inorganic sub-layers 320a, 320b, 320c and 320d, respectively, to minimize diffusion of oxygen and moisture through the encapsulation layer 300. The plurality of organic and inorganic sub-layers 310 and 320 may be arranged in an alternating pattern, so that the second inorganic sub-layer 320b, for example, may be deposited between two organic sub-layers, i.e., second and third organic sub-layers 310b and 310c, while a thickness of the second inorganic sub-layer 320b may be lower than a thickness of the second and third organic sub-layers 310b and 310c. However, other configurations of the organic and inorganic layers 310 and 320 are not excluded from the scope of the present invention.

An exemplary embodiment of a manufacturing method of the organic light emitting-display device described previously with respect to FIGS. 1-3 is as follows.

A substrate 100 having a pixel area 10 and a non-pixel area surrounding the pixel area 10 may be prepared. Next, a plurality of pixels may be formed in the pixel area 10 between scanning lines 111 and data lines 112 in a form of a matrix, as illustrated in FIG. 1, so that each pixel may be connected to an organic light-emitting diode. A pad 121 and a power source supply line (not shown) may be formed in the non-pixel area, so the pad 121 may receive a signal from outside and transmit corresponding control signals to the scan and data drive sections 130 and 140, respectively. The scan and data drive sections 130 and 140 may transmit the control signals provided through the pad 121 to the scan and data lines 111 and 112, respectively, while the power source supply line may provide power for the operation of the organic light emitting diode 200.

Next, the buffer layer 102 may be formed of an insulation layer, e.g., silicon oxide ($SiO_2$), silicon nitride (SiNx), and so forth, on the deposition substrate 101 to minimize heat damage thereto. Subsequently, the thin film transistor may be formed in a predetermined area on the buffer layer 102. The protection layer 107 may be formed and planarized on the thin film transistor to complete formation of the substrate 100. A hole may be formed in the protection layer 107 to facilitate connection of the anode electrode 210 to the source/drain electrodes 106 and 106' therethrough.

More specifically, the semiconductor layer 103 may be formed on the buffer layer 102, followed by deposition of the gate insulation layer 104 on an entire upper surface of the semiconductor layer 103 and the buffer layer 102. The gate electrode 112 may be formed on the gate insulation layer 104 in an area corresponding to an upper portion of the semiconductor layer 103. The interlayer insulation layer 105 may be formed on an upper surface of the gate insulation layer 104 and the gate electrode 112. A contact hole may be formed by patterning the interlayer insulation layer 105 and the gate insulation layer 104 for each of the source and drain electrodes 106 and 106', followed by formation of the source and drain electrodes 106 and 106' and connection thereof via the contact holes to the semiconductor layer 103.

Subsequently, the anode electrode 210 may be formed on the protection layer 107, followed by deposition of the pixel definition layer 108, e.g., an organic layer, on the protection layer 107 and the anode electrode 210. Deposition of the pixel definition layer 108 may be non-continuous on the protection layer 107 and the anode electrode 210, so that a portion of an upper surface of the anode electrode 210 may be exposed. The organic light-emitting layer 220 may be formed on the exposed upper surface of the anode electrode 210. The organic light-emitting layer 220 may have a multi-layer structure including a hole injection layer (HIL), a hole transportation layer (HTL), a light emitting layer (EML), an electron transportation layer (ETL), and an electron injection layer (EIL).

The cathode electrode 230 may be formed on the pixel definition layer 108 and the organic thin film layer 220 which includes a mixture of an opaque material and a light transmitting inorganic material. The opaque material and the light transmitting inorganic material may be mixed at a predetermined composition and applied to the pixel definition layer 108 and to the organic thin film layer 220 so that the metal density gradually increase as a vertical distance from the anode electrode 210 decreases. The cathode electrode 230 may have a predetermined height and a predetermined composition of the mixture of the opaque material and the light transmitting inorganic material to provide a visible light transmittance of about 40% to about 60%.

The encapsulation layer 300 may be formed on the cathode electrode 230. More specifically, as illustrated in FIG. 3, the organic layer 310 may be deposited on the cathode electrode 230 to facilitate planarization of the cathode electrode 230. A light beam, e.g., a UV beam or an infrared beam having a UV wave, may be directed toward the organic layer 310. The inorganic layer 320 may be formed on the organic layer 310. Next, the inorganic layer 320 may be treated with PECVD, ion beam assisted sputtering, E-beam deposition, RF sputtering, atomic layer deposition, and so forth as may be determined by one of ordinary skill in the art with respect to the specific inorganic material employed. At least one more organic layer 310 and at least one more inorganic 320 layer may be formed.

Figure 4:
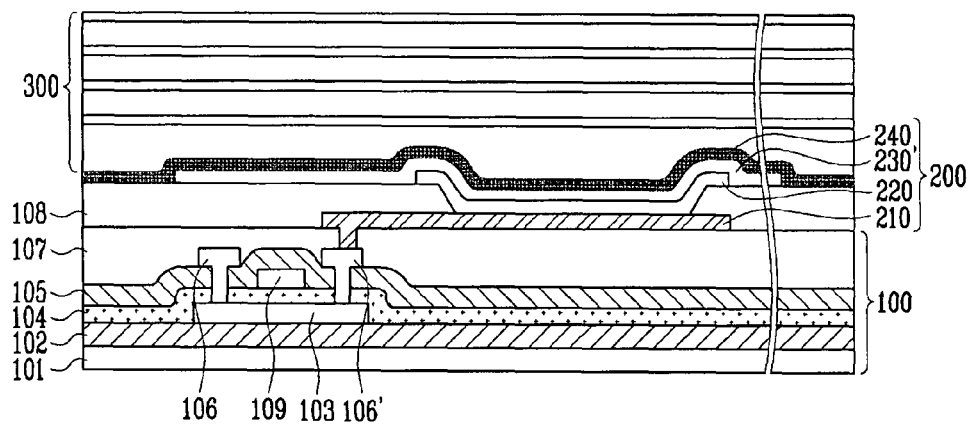
FIG. 4 illustrates an enlarged cross-sectional view of a pixel area of an organic light emitting display device according to another exemplary embodiment of the present invention.

According to yet another embodiment of the present invention illustrated in FIG. 4, an organic light-emitting display device may be similar to the organic light-emitting display device described previously with respect to FIGS. 1-3, with the addition of a functional layer on the organic light emitting diode 200. In particular, the organic light-emitting display device may include an auxiliary layer 240, i.e., a functional layer, on a cathode electrode 230'.

More specifically, as opposed to the organic light-emitting display device described in the previous embodiment as having a cathode as a functional layer, the embodiment illustrated in FIG. 4 includes a functional layer on the cathode 230'. The cathode electrode 230' may be formed of a transparent material, e.g., ITO, IZO, and so forth, and the auxiliary layer 240 may include an opaque material, e.g., metal, and a light transmitting inorganic material. Accordingly, the auxiliary layer 240 may be formed by mixing the opaque material and the light transmitting inorganic material to form an decreasing opaque material density gradient toward the encapsulation layer 300. The metal density gradient should be regulated such that the light transmittance may be about 40% to about 60%.

The encapsulation layer 300 may be formed on the auxiliary layer 240. A method of manufacturing the organic light-emitting display device illustrated in FIG. 4 is similar to the method of manufacturing of the organic light emitting display device described previously with respect to FIGS. 1-3, with the exception of formation of the auxiliary layer 240 and the cathode electrode 230', and therefore, a detailed description of the method will not be repeated herein. It should be noted, however, that since the auxiliary layer 240 may be formed separately, a reduced resistance of the cathode electrode 230' may be achieved more effectively as compared to the embodiment described previously with respect to FIGS. 1-3, and thereby, provide a minimized voltage drop. As such, the organic light emitting display device may be employed in substrates having larger sizes, i.e., a reduced voltage drop of the cathode electrode 230' may facilitate positioning thereof further from an input portion in a larger substrate, thereby maintaining uniform brightness and resolution.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made, e.g., different heights of the cathode electrode and the auxiliary layer, different materials, and so forth, without departing from the spirit and scope of the present invention as set forth in the following claims.

What is claimed is:

1. An organic light emitting display device, comprising:
    a substrate;
    a first electrode;
    an organic layer on the first electrode;
    a cathode electrode including a mixture of an opaque material and a light transmitting inorganic material dispersed therein; and
    an encapsulation layer on the cathode electrode and in direct contact with the cathode electrode, the encapsulation layer including at least one inorganic layer and at least one organic layer alternately arranged, and the at least one organic layer or the at least one inorganic layer being in direct contact with the cathode electrode, wherein:
    a density gradient of the opaque material in the cathode electrode gradually decreases along substantially an entire depth of the cathode electrode, and the density gradient decreases as a distance to the encapsulation layer decreases; and
    the density gradient of the opaque material is capable of minimizing interface reflection of light from the organic layer.

2. The organic light emitting display device as claimed in claim 1, wherein the cathode electrode has a light transmittance of about 40% to about 60% based on the mixture of the opaque material and the light transmitting inorganic material dispersed in the cathode electrode.

3. The organic light emitting display device as claimed in claim 1, wherein the opaque material includes at least one of iron (Fe), cobalt (Co), vanadium (V), titanium (Ti), aluminum (Al), silver (Ag), silicon (Si), germanium (Ge), yttrium (Y), zirconium (Zr), tungsten (W), tantalum (Ta), copper (Cu), and platinum (Pt).

4. The organic light emitting display device as claimed in claim 1, wherein the inorganic material of the cathode electrode includes at least one of silicon oxide (SiOx), silicon nitride (SiNx), magnesium fluoride (MgF$_2$), calcium fluoride (CaF$_2$), aluminum oxide (Al$_2$O$_3$), tin oxide (SnO$_2$), indium oxide (In$_2$O$_3$), indium-tin-oxide (ITO), and indium-zinc-oxide (IZO).

5. The organic light emitting display device as claimed in claim 1, wherein the inorganic layer of the encapsulation layer includes aluminum oxynitride (AlOxNy) or silicon oxynitride (SiOxNy).

6. The organic light emitting display device as claimed in claim 1, wherein a thickness of the inorganic layer of the encapsulation layer is about 30 to about 100 nm.

7. The organic light emitting display device as claimed in claim 1, wherein the organic layer of the encapsulation layer includes a UV-hardened resin.

8. The organic light emitting display device as claimed in claim 1, wherein the organic layer of the encapsulation layer includes epoxy, acrylate, or urethane acrylate.

9. The organic light emitting display device as claimed in claim 1,
    wherein the encapsulation layer includes a plurality of organic layers and a plurality of inorganic layers alternately arranged.

10. The organic light emitting display device as claimed in claim 1, further comprising a pixel definition layer in communication with the cathode electrode.

11. The organic light emitting display device as claimed in claim 10, wherein the pixel definition layer is an organic layer.

12. An organic light emitting display device, comprising:
    a substrate;
    a first electrode,
    an organic layer on the first electrode, and
    a second electrode on the organic layer;
    a functional layer including a mixture of an opaque material and a light transmitting inorganic material dispersed therein, the functional layer being an auxiliary layer on the second electrode; and
    an encapsulation layer on the functional layer, the encapsulation layer including at least one inorganic layer and at least one organic layer, and the functional layer being in direct contact with the encapsulation layer, wherein:
    a density gradient of the opaque material in the functional layer gradually decreases along substantially an entire depth of the functional layer, and the density gradient decreases as a distance to the encapsulation layer decreases; and
    the density gradient of the opaque material is capable of minimizing interface reflection of light from the organic layer.

13. The organic light emitting display device as claimed in claim 12, wherein the second electrode has a light transmittance of about 40% to about 60% based on the mixture of the opaque material and the light transmitting inorganic material dispersed in the functional layer.

14. The organic light emitting display device as claimed in claim 12,
wherein the encapsulation layer includes a plurality of organic layers between a plurality of inorganic layers alternately arranged, such that a first organic layer or a first inorganic layer is in direct contact with the functional layer.

15. The organic light emitting display device as claimed in claim 14, wherein the opaque material includes at least one of iron (Fe), cobalt (Co), vanadium (V), titanium (Ti), aluminum (Al), silver (Ag), silicon (Si), germanium (Ge), yttrium (Y), (zirconium (Zr), tungsten (W), tantalum (Ta), copper (Cu), and platinum (Pt).

16. The organic light emitting display device as claimed in claim 14, wherein the inorganic material of the functional layer includes at least one of silicon oxide (SiOx), silicon nitride (SiNx), magnesium fluoride ($MgF_2$), calcium fluoride ($CaF_2$), aluminum oxide ($Al_2O_3$), tin oxide ($SnO_2$), indium oxide ($In_2O_3$), indium-tin-oxide (ITO), and indium-zinc-oxide (IZO).

17. The organic light emitting display device as claimed in claim 14, wherein the inorganic layer of the encapsulation layer includes aluminum oxynitride (AlOxNy) or silicon oxynitride (SiOxNy).

18. The organic light emitting display device as claimed in claim 14, wherein the organic layer of the encapsulation layer includes epoxy, acrylate, or urethane acrylate.

19. The organic light emitting display device as claimed in claim 12, further comprising a pixel definition layer in communication with the second electrode.

20. The organic light emitting display device as claimed in claim 19, wherein the pixel definition layer is an organic layer.

21. The organic light emitting display device as claimed in claim 12, wherein a thickness of the inorganic layer of the encapsulation layer is about 30 to about 100 nm.

22. A method for manufacturing an organic light emitting display device, comprising:
providing a substrate;
forming a first electrode on the substrate;
forming an organic layer on the first electrode;
forming a cathode electrode on the organic layer by depositing a mixture including an opaque material and a light transmitting inorganic material dispersed therein; and
forming an encapsulation layer on the cathode electrode and in direct contact with the cathode electrode, the encapsulation layer including at least one inorganic layer and at least one organic layer alternately arranged, and the at least one organic layer or the at least one inorganic layer being in direct contact with the cathode electrode, wherein:
a density gradient of the opaque material in the cathode electrode gradually decreases along substantially an entire depth of the cathode electrode, and the density gradient decreases as a distance to the encapsulation layer decreases; and
the density gradient of the opaque material is capable of minimizing interface reflection of light from the organic layer.

23. The method for manufacturing an organic light emitting display device as claimed in claim 22, further comprising irradiating the encapsulation layer with UV light.

24. A method for manufacturing an organic light emitting display device, comprising:
providing a substrate;
forming a first electrode on the substrate;
forming an organic layer on the first electrode;
forming a second electrode on the organic layer;
forming a functional layer on the second electrode by depositing a mixture including an opaque material and a light transmitting inorganic material dispersed therein, the functional layer being an auxiliary layer on the second electrode; and
forming an encapsulation layer on the functional layer, the encapsulation layer including a least one inorganic layer and at least one organic layer, and the functional layer being in direct contact with the encapsulation layer, wherein:
a density gradient of the opaque material in the functional layer gradually decreases along substantially an entire depth of the functional layer, and the density gradient decreases as a distance to the encapsulation layer decreases; and
the density gradient of the opaque material is capable of minimizing interface reflection of light from the organic layer.

25. The method for manufacturing an organic light emitting display device as claimed in claim 24, further comprising irradiating the encapsulation layer with UV light.

* * * * *